United States Patent
Matsumoto et al.

(10) Patent No.: US 10,115,595 B2
(45) Date of Patent: Oct. 30, 2018

(54) METHOD OF MANUFACTURING SEMICONDUCTOR DEVICE AND SEMICONDUCTOR DEVICE

(71) Applicant: Sumitomo Heavy Industries, Ltd., Tokyo (JP)

(72) Inventors: Satoru Matsumoto, Tokyo (JP); Teruhisa Kawasaki, Kanagawa (JP)

(73) Assignee: SUMITOMO HEAVY INDUSTRIES, LTD., Tokyo (JP)

( * ) Notice: Subject to any disclaimer, the term of this patent is extended or adjusted under 35 U.S.C. 154(b) by 0 days.

(21) Appl. No.: 15/274,982

(22) Filed: Sep. 23, 2016

(65) Prior Publication Data

US 2017/0011924 A1    Jan. 12, 2017

Related U.S. Application Data

(63) Continuation of application No. PCT/JP2015/058156, filed on Mar. 19, 2015.

(30) Foreign Application Priority Data

Mar. 25, 2014 (JP) .................. 2014-061045

(51) Int. Cl.
*H01L 21/265* (2006.01)
*H01L 21/268* (2006.01)
(Continued)

(52) U.S. Cl.
CPC ...... *H01L 21/26546* (2013.01); *H01L 21/268* (2013.01); *H01L 21/3245* (2013.01); *H01L 29/2003* (2013.01)

(58) Field of Classification Search
CPC ............ H01L 21/26546; H01L 21/268; H01L 21/3245; H01L 29/2003; H01L 21/324;
(Continued)

(56) References Cited

U.S. PATENT DOCUMENTS 5,011,794 A    4/1991    Grim et al.
2004/0235281 A1    11/2004    Downey et al.
(Continued)

FOREIGN PATENT DOCUMENTS

JP    H02-303121 A    12/1990
JP    2003-059856 A    2/2003
(Continued)

OTHER PUBLICATIONS

International Search Report issued in Application No. PCT/JP2015/058156, dated Jun. 9, 2015.

*Primary Examiner* — Shahed Ahmed
(74) *Attorney, Agent, or Firm* — Michael Best & Friedrich LLP

(57) ABSTRACT

A dopant is ion-injected to a semiconductor layer formed of a group III-V compound semiconductor containing nitrogen as a Group V element. A first activation annealing is performed on the semiconductor layer having the ion-injected dopant using a heat-treating furnace under temperature conditions of 700° C. to 900° C. After the first activation annealing is performed, a second activation annealing is performed by allowing a pulsed laser beam to be incident on the semiconductor layer. A dopant activation rate can be improved using the above-described method.

4 Claims, 6 Drawing Sheets

(51) Int. Cl.
*H01L 21/324* (2006.01)
*H01L 29/20* (2006.01)

(58) Field of Classification Search
CPC ............. H01L 21/477; H01L 27/14698; H01L 51/0026; H01L 33/30; H01L 2224/11848; H01L 2224/43848
USPC .................................. 257/194; 438/662, 663
See application file for complete search history.

(56) References Cited

U.S. PATENT DOCUMENTS

| | | | |
|---|---|---|---|
| 2013/0062666 A1 | 3/2013 | Imada | |
| 2014/0054680 A1* | 2/2014 | Hashimoto | H01L 21/3242 257/329 |
| 2015/0099350 A1* | 4/2015 | Srinivasan | H01L 21/3245 438/522 |
| 2016/0061528 A1* | 3/2016 | Derenge | H01L 21/3245 432/254.1 |

FOREIGN PATENT DOCUMENTS

| | | |
|---|---|---|
| JP | 2004-273486 A | 9/2004 |
| JP | 2007-535174 A | 11/2007 |
| JP | 2008-135700 A | 6/2008 |
| JP | 2009-170604 A | 7/2009 |
| JP | 2013-062365 A | 4/2013 |
| JP | 2014-041917 A | 3/2014 |
| WO | WO-2005/106939 A1 | 11/2005 |

\* cited by examiner $$OVm = \frac{Wm}{L}$$

$$OVs = \frac{Ws}{L}$$

METHOD OF MANUFACTURING SEMICONDUCTOR DEVICE AND SEMICONDUCTOR DEVICE

RELATED APPLICATIONS

Priority is claimed to Japanese Patent Application No. 2014-061045, filed Mar. 25, 2014, and International Patent Application No. PCT/JP2015/058156, the entire content of each of which is incorporated herein by reference.

BACKGROUND

Technical Field

Certain embodiments of the present invention relate to a method of manufacturing a semiconductor device that activates a dopant ion-injected into a group III-V compound semiconductor containing nitrogen as a Group V element and a semiconductor device.

Description of Related Art

A group III-V compound semiconductor containing nitrogen as a Group V element, for example, gallium nitride (GaN) is expected to be applied to next-generation high frequency power devices from the viewpoint of a large band gap. For the purpose of applying GaN to various devices, a technique of locally forming a p-type or n-type region is required. A technique of forming a p-type or n-type region by ion-injecting a p-type or n-type dopant into a semiconductor such as silicon is established. The related art discloses a technique of forming p-type GaN by ion-injecting Mg, which is a p-type dopant, into GaN using an ion-injecting technique and performing laser annealing.

SUMMARY

According to an embodiment of the present invention, there is provided a method of manufacturing a semiconductor device including: ion-injecting a dopant into a semiconductor layer formed of a group III-V compound semiconductor containing nitrogen as a Group V element; performing a first activation annealing on the semiconductor layer having the ion-injected dopant using a heat-treating furnace under temperature conditions of 700° C. to 900° C.; and performing a second activation annealing by allowing a pulsed laser beam to be incident on the semiconductor layer after the first activation annealing is performed.

According to another embodiment of the present invention, there is provided a semiconductor device including: an ion injection unit that is formed on a support substrate and ion-injects a dopant into a semiconductor layer formed of a group III-V compound semiconductor containing nitrogen as a Group V element; a first activation annealing unit that performs a first activation annealing on the semiconductor layer having the ion-injected dopant using a heat-treating furnace under temperature conditions of 700° C. to 900° C.; and a second activation annealing unit that performs a second activation annealing by allowing a pulsed laser beam to be incident on the semiconductor layer after the first activation annealing is performed.

DETAILED DESCRIPTION

According to evaluations and experiments of the present inventors of the present application, it was understood that an activation rate is unlikely to be sufficiently increased when a method of ion-injecting Mg into GaN and performing laser annealing for activation is used. It is desirable to provide a method of manufacturing a semiconductor device which is capable of improving the activation rate of a dopant.

It is possible to increase the activation rate of an ion-injected dopant by combining annealing using a heat-treating furnace with laser annealing using a pulsed laser beam.

A method of manufacturing a semiconductor device according to an example will be described with reference to FIGS. 1A to 1C.

Figure 1A:
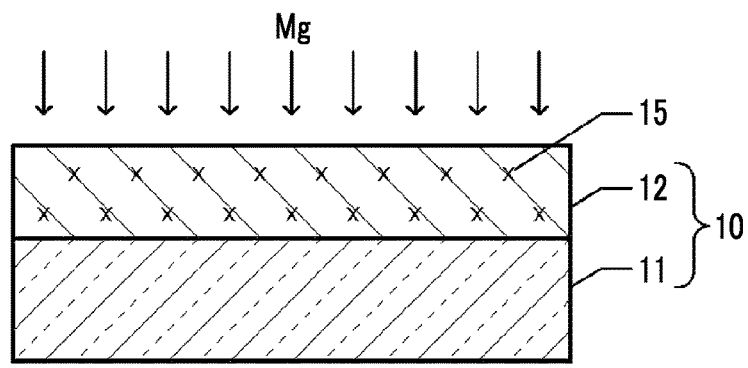
FIGS. 1A to 1C are sectional views illustrating a substrate in the middle of manufacture using a method of manufacturing a semiconductor substrate according to an example.

As illustrated in FIG. 1A, a semiconductor layer 12 formed of gallium nitride (GaN) is epitaxially grown on a support substrate 11 formed of sapphire. The support substrate 11 and the semiconductor layer 12 are collectively referred to as a substrate 10. As a p-type dopant, magnesium (Mg) is ion-injected into the semiconductor layer 12. Due to this ion injection, lattice defects 15 occur on the semiconductor layer 12.

Figure 1B:
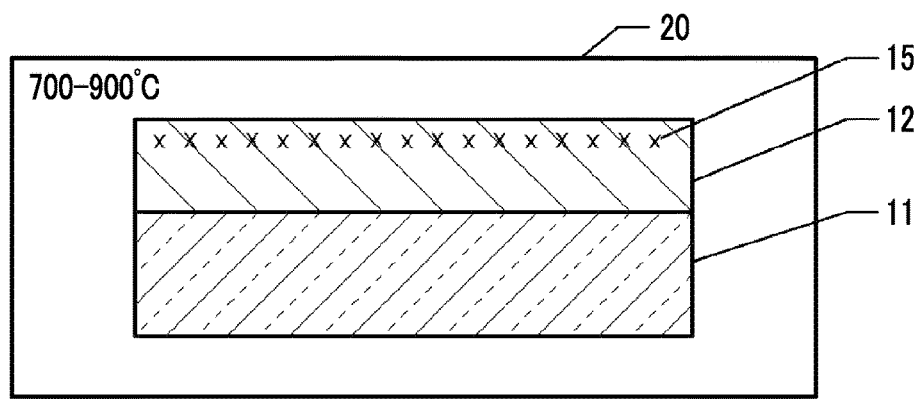

As illustrated in FIG. 1B, the substrate 10 after ion injection is disposed in a heat-treating furnace 20. First activation annealing is performed on the semiconductor layer 12 containing a dopant using the heat-treating furnace 20 under temperature conditions of 700° C. to 900° C. Because of this first activation annealing, a part of the dopant injected into the semiconductor layer 12 is activated and crystallinity of a region damaged by the ion injection is recovered. Apart of the lattice defects 15, particularly, depletion type defects move toward the surface of the semiconductor layer 12.

Figure 1C:
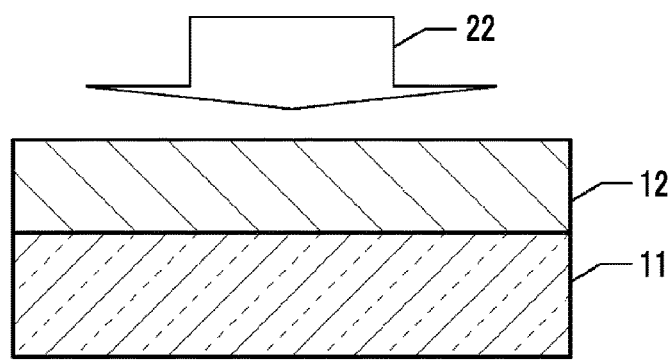

As illustrated in FIG. 1C, second activation annealing is performed by allowing a pulsed laser beam 22 to be incident on the semiconductor layer 12 of the substrate 10 in which the first activation annealing is finished. The second activation annealing is performed in a nitrogen atmosphere. When the pulsed laser beam 22 is incident on the surface of the semiconductor layer 12, a shallow region of the semiconductor layer 12 is locally heated. Most of the lattice defects 15 (FIG. 1B) having moved toward the surface of the semiconductor layer 12 at the time of the first activation annealing disappear due to the heating. Third harmonics of solid-state laser such as Nd:YAG laser, Nd:YLF laser, Nd:YVO4 laser, and the like are used as the pulsed laser beam 22. The wavelength thereof is in a range of 349 nm to 355 nm.

Figure 2:
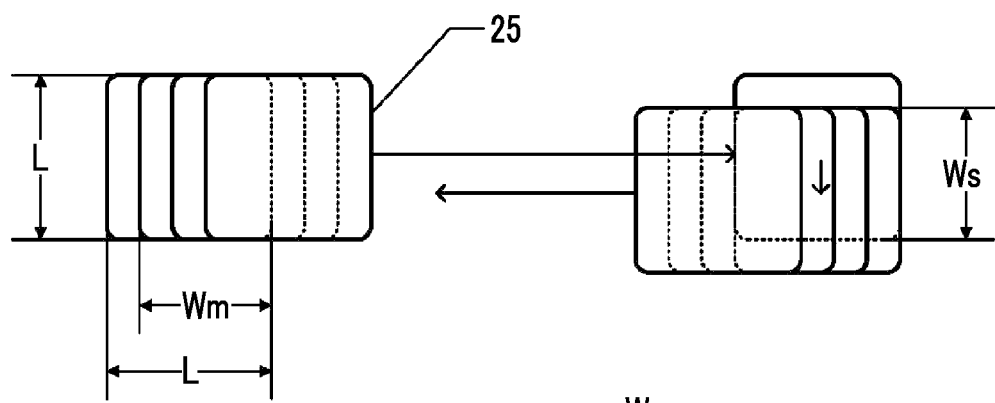
FIG. 2 is a view illustrating a method of scanning a pulsed laser beam at the time of performing second activation annealing.

A method of scanning the pulsed laser beam 22 (FIG. 1C) at the time of performing second activation annealing will be described with reference to FIG. 2. As an example, a beam spot 25 of the pulsed laser beam 22 on the surface of the semiconductor layer 12 (FIG. 1C) has a shape of a square having a side with a length L of approximately 100 μm. The beam spot 25 is allowed to move in a main scanning direction (lateral direction in FIG. 2) on the surface of the semiconductor layer 12 while the pulsed laser beam 22 (FIG. 1C) is allowed to be incident on the surface thereof.

When main scanning carried out once is finished, the beam spot 25 is allowed to move in a sub-scanning direction (longitudinal direction in FIG. 2) and then the next main scanning is started. Overlapping widths of the beam spot 25 of two shots which are temporally adjacent to each other in the main scanning direction and the sub-scanning direction are respectively expressed as Wm and Ws. An overlap ratio OVm in the main scanning direction and an overlap ratio OVs in the sub-scanning direction are respectively defined using the following equation.

OVm=Wm/L

OVs=Ws/L

Next, the conditions of applying the pulsed laser beam 22 at the time of the second activation annealing will be described. The surface temperature of the semiconductor layer 12 (FIG. 1C) begins to increase when a laser pulse of the pulsed laser beam 22 rises and the surface temperature begins to decrease when a laser pulse falls down. It is preferable to select a condition in which the highest reachable temperature of the surface when one shot of the pulsed laser beam 22 is allowed to be incident is 900° C. or lower which is the dissociation temperature of nitrogen of GaN.

As a result of simulation performed by setting the pulse width to 50 ns, it is understood that the highest reachable temperature exceeds 900° C. when the pulse energy density is 0.8 J/cm$^2$ and the highest reachable temperature is 900° C. or lower when the pulse energy density is 0.6 J/cm$^2$. In addition, even when the pulse width is a value other than 50 ns, the highest reachable temperature does not fluctuate greatly if the pulse energy density is the same.

Figure 3:
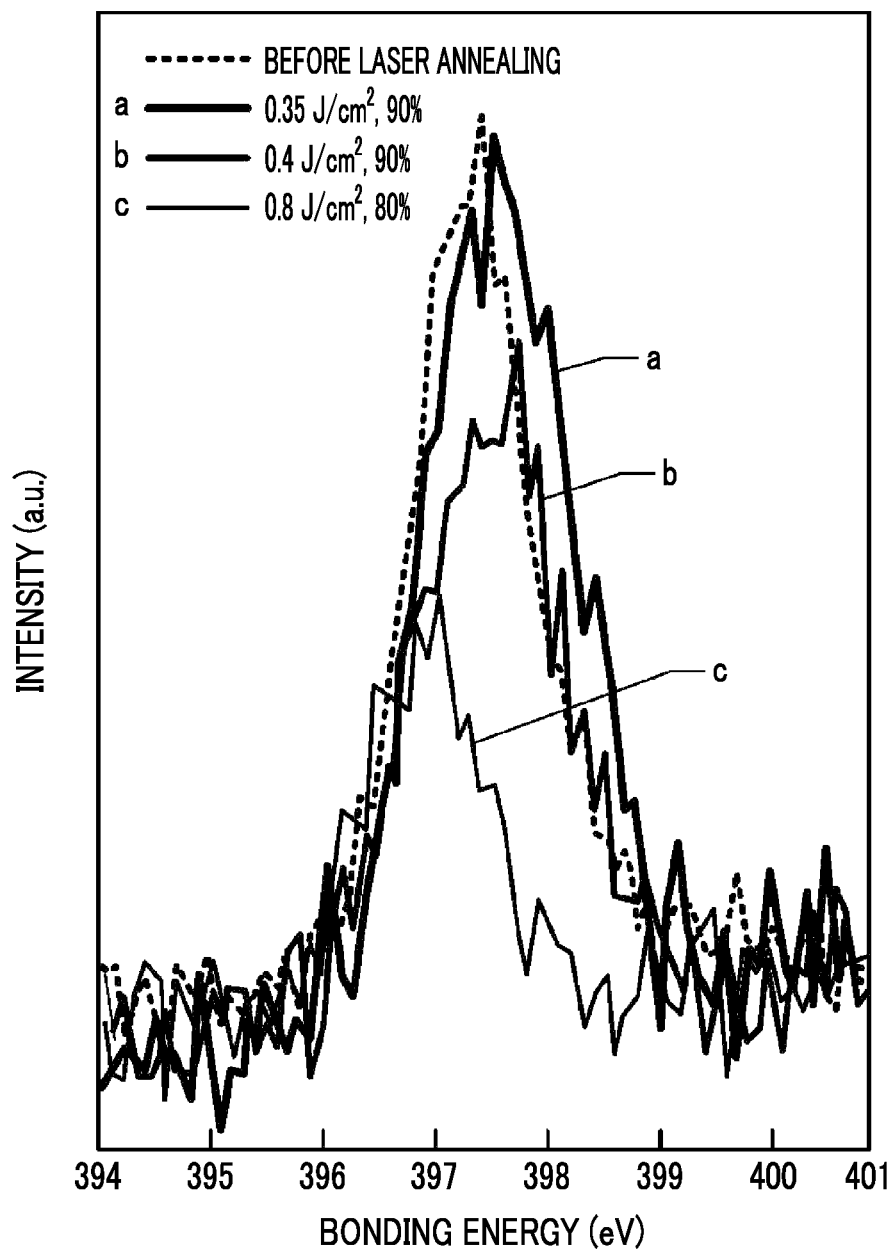
FIG. 3 is a graph showing results of X-ray photoelectron spectroscopic analysis before and after a pulse laser beam is allowed to be incident on a semiconductor layer formed of GaN.

FIG. 3 shows results of X-ray photoelectron spectroscopic analysis before and after a pulsed laser beam is allowed to be incident on the semiconductor layer 12 (FIG. 1C) formed of GaN. The horizontal axis represents bonding energy using the unit "eV" and the vertical axis represents photoelectron intensity using an arbitrary unit. FIG. 3 shows the peak of nitrogen (Nis). The broken line of FIG. 3 shows the analysis result of the semiconductor layer before the pulsed laser beam is allowed to be incident on the surface thereof. A solid line a of FIG. 3 shows the analysis result of the semiconductor layer after laser annealing is performed under the conditions in which the pulse energy density is 0.35 J/cm$^2$ and the overlap ratios OVm and OVs in the main scanning direction and the sub-scanning direction are respectively 90%. A solid line b shows the analysis result of the semiconductor layer after laser annealing is performed under the conditions in which the pulse energy density is 0.4 J/cm$^2$ and the overlap ratios OVm and OVs are respectively 90%. A solid line c shows the analysis result of the semiconductor layer after laser annealing is performed under the conditions in which the pulse energy density is 0.8 J/cm$^2$ and the overlap ratios OVm and OVs are respectively 80%.

When the pulse energy density is set to 0.8 J/cm$^2$, it is understood that dissociation of nitrogen in the semiconductor layer is significant. Under the condition of a pulse energy density of 0.35 J/cm$^2$, dissociation of nitrogen does not almost occur. As understood from the evaluation result shown in FIG. 3, it is preferable that the pulse energy density of the pulsed laser beam 22 at the time of second activation annealing is set to 0.35 J/cm$^2$ for the purpose of suppressing dissociation of nitrogen in the semiconductor layer.

Figure 4:
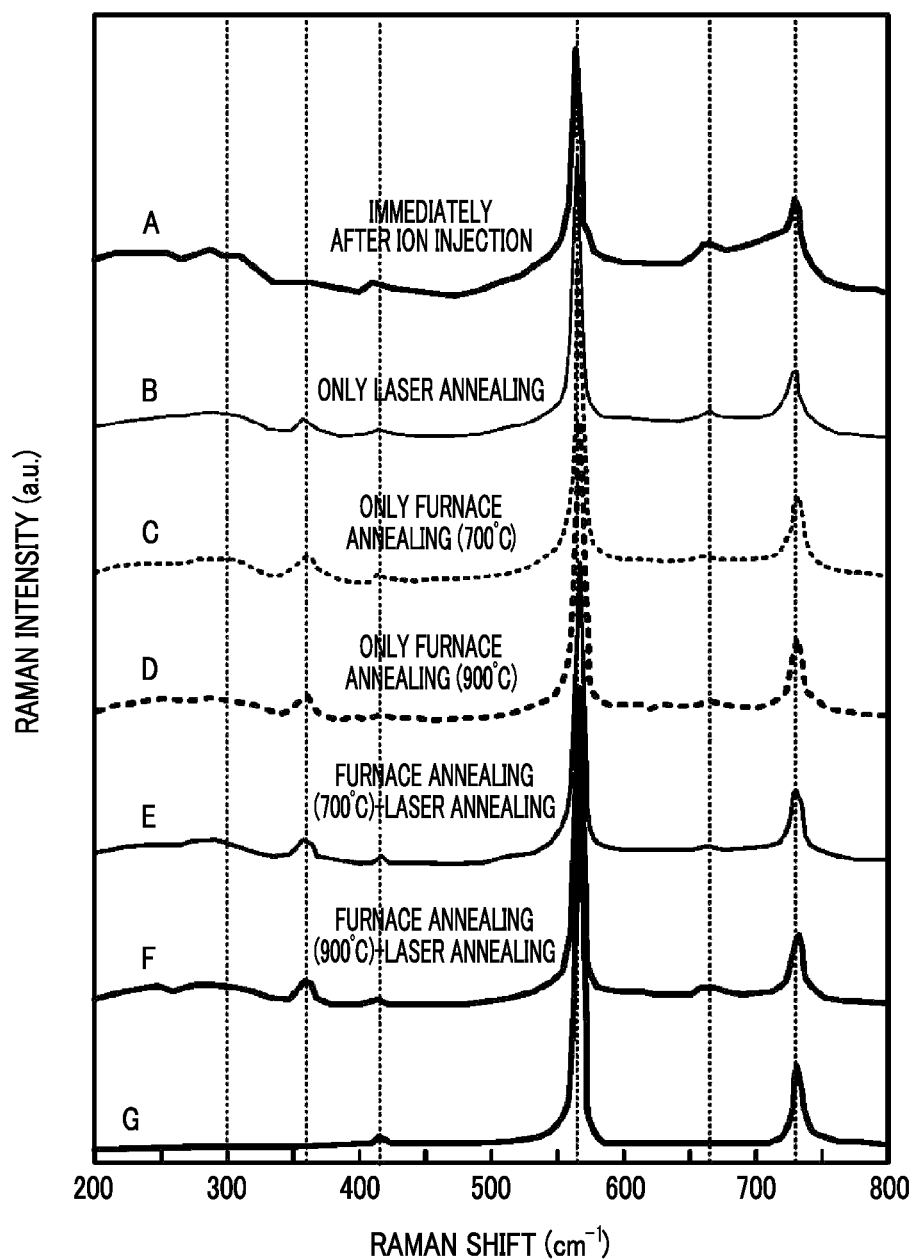
FIG. 4 is a graph showing results of Raman spectroscopic analysis performed on a semiconductor layer to which Mg is ion-injected and which is formed of GaN.

FIG. 4 shows results of Raman spectroscopic analysis performed on a semiconductor layer to which Mg is ion-injected and which is formed of GaN. The horizontal axis represents the Raman shift using the unit "cm$^{-1}$" and the vertical axis represents the Raman intensity. Solid lines of FIG. 4 show analysis results of samples A to G. The sample G is a sample in which Mg has not been ion-injected into the semiconductor layer 12 (FIG. 1A) and samples A to F are samples in which Mg has been ion-injected into the semiconductor layer 12. Mg are injected thereinto in multiple stages under the conditions of accelerating energies of 20 keV, 80 keV, and 120 keV.

The sample A is a sample on which laser annealing is not performed after the ion injection. The sample B is a sample on which laser annealing is performed after ion injection. The sample C is a sample on which furnace annealing is performed at 700° C. for 20 minutes after ion injection. The sample D is a sample on which furnace annealing is performed at 900° C. for 20 minutes after ion injection. The sample E is a sample on which furnace annealing is performed at 700° C. for 20 minutes after ion injection and laser annealing is further performed. The sample F is a sample on which furnace annealing is performed at 900° C. for 20 minutes after ion injection and laser annealing is further performed. In all of the samples B, E, and F, laser annealing is performed at a pulse energy density of 0.35 J/cm$^2$ and an overlap ratio OVm of 90% and an overlap ratio OVs of 90%.

In the sample G, peaks appear at the positions of 418 cm$^{-1}$, 567.6 cm$^{-1}$, and 734 cm$^{-1}$. The peak at 418 cm$^{-1}$ is based on the sapphire of the support substrate 11. The peak at 567.6 cm$^{-1}$ is based on vibration of nitrogen in the lateral direction. The peak at 734 cm$^{-1}$ is based on a longitudinal optical mode. These three peaks are common to a GaN layer which is epitaxially grown on the sapphire substrate.

In the sample A after ion injection, peaks appear at the positions of 300 cm$^{-1}$ and 670 cm$^{-1}$. These peaks are caused by lattice defects, for example, holes or the like of nitrogen. It is understood that many lattice defects are introduced into the semiconductor layer by performing ion injection. In the samples B to F, a peak appears at the position of Raman shift of 360 cm$^{-1}$. This peak corresponds to activation of ion-injected Mg.

Figure 5A:
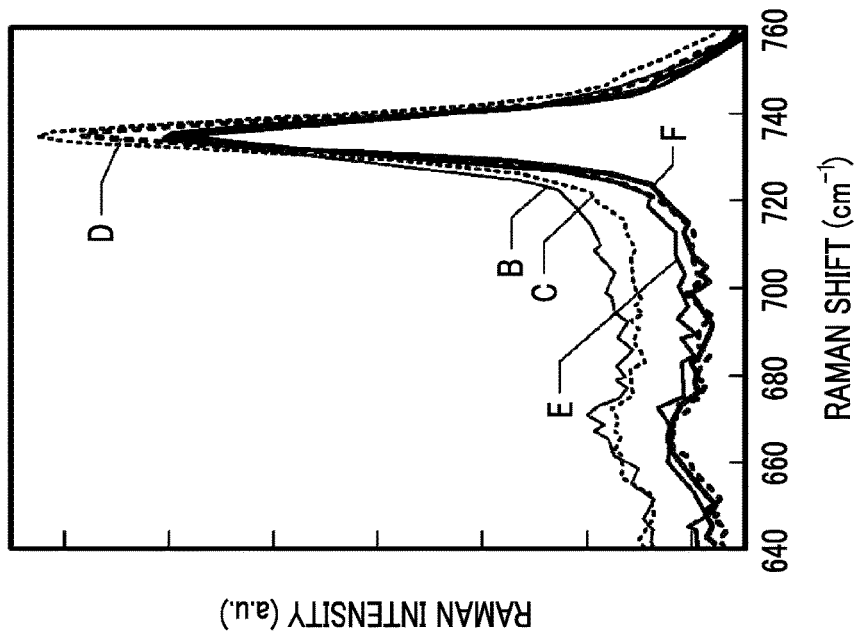
FIGS. 5A and 5B are graphs obtained by enlarging a part of the results of Raman spectroscopic analysis shown in FIG. 4.
Figure 5B:
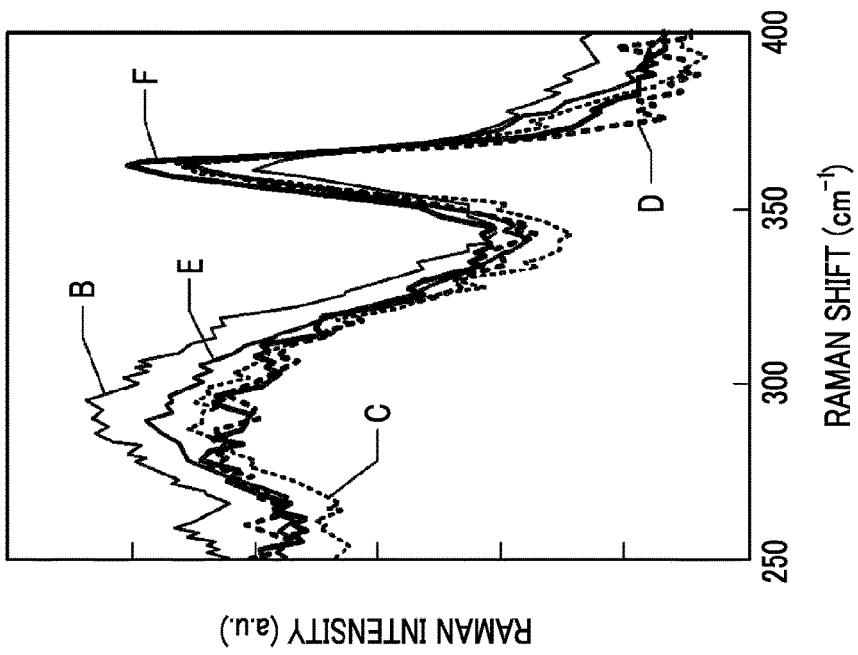

FIGS. 5A and 5B are graphs obtained by respectively enlarging a part of FIG. 4. When Raman intensities of respective samples in the vicinity of Raman shift of 300 cm$^{-1}$ are compared to each other, it is understood that the peaks of the samples C and D on which only furnace annealing is performed and the peaks of the samples E and F on which both of furnace annealing and laser annealing are performed are lower than the peak of the sample B on which only laser annealing is performed. This means that the furnace annealing is more suitable for reducing lattice defects of Ga holes or the like than the laser annealing.

When Raman intensities of respective samples in the vicinity of Raman shift of 670 cm$^{-1}$ are compared to each other, the Raman intensity of the sample B on which only laser annealing is performed and the Raman intensity of the sample C on which only furnace annealing at 700° C. is performed are high. From this evaluation result, it is understood that annealing at approximately 900° C. which is higher than 700° C. is useful for reducing lattice defects such as holes of nitrogen and interstitial atoms.

When the peaks of respective samples in the vicinity of Raman shift of 360 cm$^{-1}$ are compared to each other, the peak of the sample F on which both of furnace annealing at 900° C. and laser annealing are performed is the highest. This means that the activation rate of ion-injected Mg of the sample F is most excellent.

Figure 6:
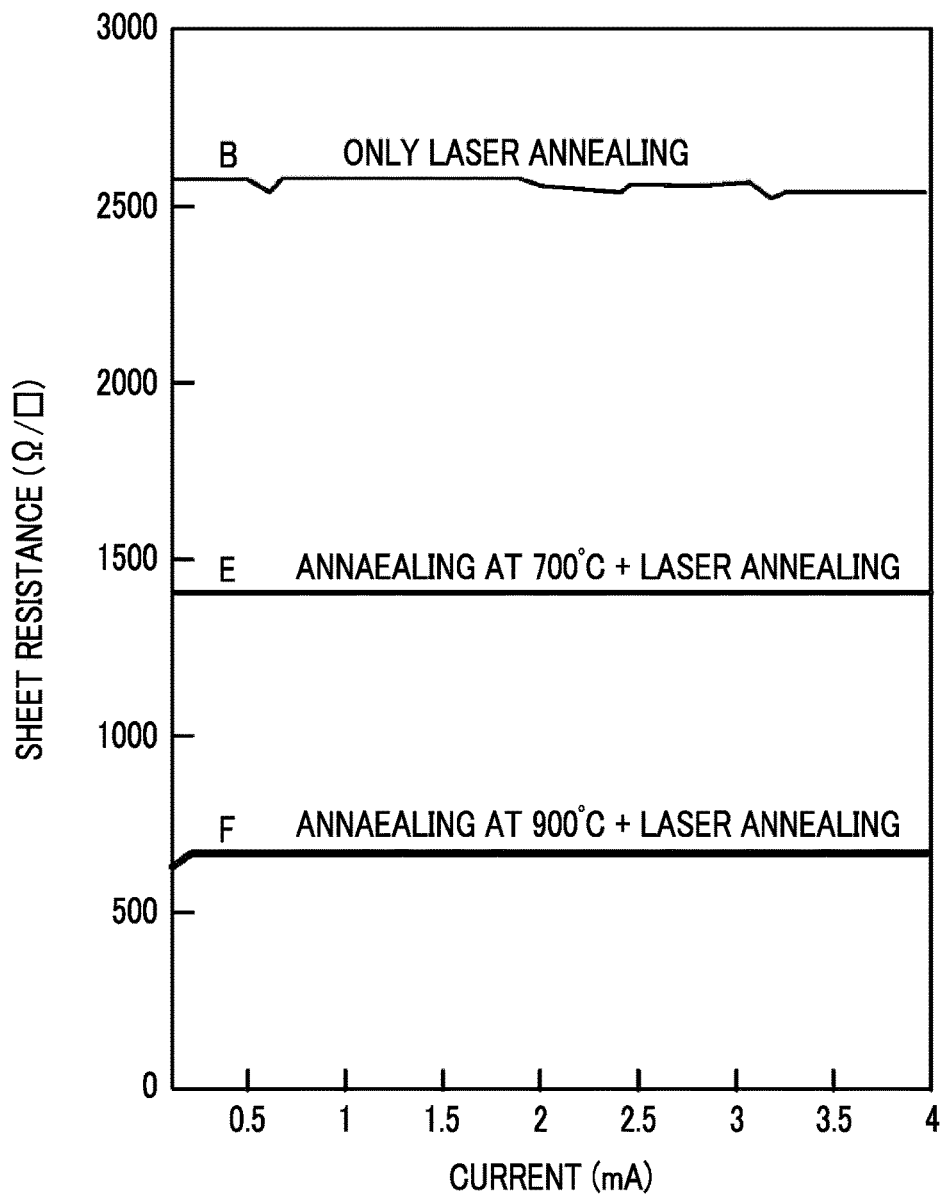
FIG. 6 is a graph showing measurement results of sheet resistance of a sample.

FIG. 6 shows measurement results of sheet resistances of the samples B, E, and F. The sheet resistance is measured according to a four-probe measurement method. The horizontal axis of FIG. 6 represents the current using the unit "mA" and the longitudinal axis represents the sheet resistance using the unit "Ω/□". The sheet resistances of the samples E and F on which both of furnace annealing and laser annealing are performed are lower than the sheet resistance of the sample B on which only laser annealing is performed. When it is assumed that the mobility of a positive hole in GaN is 200 cm$^2$/V·s, the sheet resistance becomes 104 Ω/□ in a case where 100% of the ion-injected Mg is activated. The sheet resistance being decreased by performing both of furnace annealing and laser annealing means that the activation rate of Mg is increased.

When the Hall coefficients of the samples E and F on which furnace annealing and laser annealing are performed are measured, it is confirmed that both samples have positive Hall coefficients. This means that Mg is activated and p-type GaN is obtained. On the contrary, in the sample B on which only laser annealing is performed, a positive Hall coefficient cannot be obtained. When a combination of ion injection, furnace annealing, and laser annealing is used, p-type GaN can be obtained.

In the above-described example, GaN is used as the semiconductor layer 12 (FIGS. 1A to 1C), and it is effective to use a combination of furnace annealing and laser annealing even in a case where a group III-V compound semiconductor containing nitrogen as a Group V element is used.

It should be understood that the invention is not limited to the above-described embodiment, but may be modified into various forms on the basis of the spirit of the invention. Additionally, the modifications are included in the scope of the invention.

What is claimed is:

1. A method of manufacturing a semiconductor device comprising:
   ion-injecting a dopant into a semiconductor layer formed of a group III-V compound semiconductor containing nitrogen as a Group V element;
   performing a first activation annealing on the semiconductor layer having the ion-injected dopant using a heat-treating furnace under temperature conditions of 700° C. to 900° C.; and
   performing a second activation annealing by allowing a pulsed laser beam to be incident on the semiconductor layer after the first activation annealing is performed,
   wherein annealing is performed in a nitrogen atmosphere during the performing of the second activation annealing.

2. The method of manufacturing a semiconductor device according to claim 1,
   wherein a pulsed laser beam having a wavelength of 349 nm to 355 nm which is a third harmonic of a solid-state laser is used during the performing of the second activation annealing.

3. The method of manufacturing a semiconductor device according to claim 1,
   wherein the pulsed laser beam is allowed to be incident on the semiconductor layer under the conditions in which a pulse energy density on the surface of the semiconductor layer is 0.35 J/cm$^2$ or less during the performing of the second activation annealing.

4. The method of manufacturing a semiconductor device according to claim 1,
   wherein crystallinity of a region damaged by the ion-injecting of the dopant is recovered during the first activation annealing, the dopant is activated, and a part of lattice defects in the semiconductor layer moves toward the surface of the semiconductor layer, and
   the lattice defects having moved toward the surface of the semiconductor layer at the time of the first activation annealing disappear during the second activation annealing.

* * * * *